United States Patent [19]
Robinson

[11] 4,301,445
[45] Nov. 17, 1981

[54] COMMUNICATION SYSTEM AND METHOD HAVING WIDE DYNAMIC RANGE DIGITAL GAIN CONTROL

[75] Inventor: Paul B. Robinson, Durham, N.H.

[73] Assignee: General Electric Company, Somersworth, N.H.

[21] Appl. No.: 101,450

[22] Filed: Dec. 10, 1979

[51] Int. Cl.³ .......................... H04B 1/16; H04Q 9/00
[52] U.S. Cl. ............................ 340/825.54; 330/284; 375/98
[58] Field of Search ...................... 375/98, 14, 16, 11; 340/152 T; 364/574; 455/200, 245, 249; 330/284

[56] References Cited

U.S. PATENT DOCUMENTS

| | | |
|---|---|---|
| 3,137,847 | 6/1964 | Kleist .......................... 340/152 T |
| 3,716,849 | 2/1973 | Metcalf ........................... 364/574 |
| 3,746,989 | 7/1973 | Heim ............................... 375/16 |
| 3,848,191 | 11/1974 | Anderson ........................ 375/98 |
| 3,882,484 | 5/1975 | Brokaw et al. ................... 375/34 |
| 4,121,183 | 10/1978 | Murphy ............................ 330/284 |
| 4,157,557 | 6/1979 | Sato et al. ....................... 330/284 |
| 4,161,628 | 7/1979 | McRae et al. .................... 375/98 |

*Primary Examiner*—Donald J. Yusko
*Attorney, Agent, or Firm*—Robert E. Brunson

[57] ABSTRACT

An automatic gain control system and method, utilizing a digital logic attenuator and control in a communication receiver, operates linearly over a wide dynamic range in the amplitude of input signals applied to the receiver to eliminate distortion and frequency intermodulation products inherent in single channel and multi-channel frequency multiplex communication systems.

10 Claims, 8 Drawing Figures

Fig. 4.

COMMUNICATION SYSTEM AND METHOD HAVING WIDE DYNAMIC RANGE DIGITAL GAIN CONTROL

BACKGROUND OF THE INVENTION

This invention relates generally to automatic gain control circuits and to systems employing such circuits. In one particular aspect, the invention relates to a linear digital gain control circuit in a data communication receiver and a method of automatic gain control which prevents signal distortion, amplifier saturation and inter-modulation of signals presented to the receiver.

In another aspect, the invention relates to a linear digital gain control circuit and receiver for use in frequency multiplex communication systems of the type wherein the amplitude of transmitted data signals of several frequencies varying over a wide range of signal levels are digitally controlled to substantially eliminate frequency intermodulation products of the several frequencies from interfering with other ones of the frequencies to allow the data signals to be selectively received by one or more receiver circuits tuned to respective ones of the several frequencies.

FIELD OF THE INVENTION

In certain types of data communication systems, it is sometimes expedient to transmit data signals from one or more signal sources, wherein the data signals are comprised of frequency multiplexed data in the form of several simultaneously generated frequencies which may vary over a wide range of signal levels at the receiver or receivers receiving the data signals. In these types of systems, each frequency comprises a data channel for carrying information to be received by an automatic gain control (AGC) circuit in a receiver feeding one or more mixer and IF filter amplifiers tuned to the frequency of each data channel. In a simplex system, a receiver tuned to a specific frequency has no trouble detecting and receiving the data signals at its tuned frequency since it is the only signal seen by the receiver. In frequency multiplexed communication systems, however, wherein each of several receivers is tuned to a different frequency or channel, frequency intermodulation products of the frequencies of the several channels often interfere with the frequency of one or more other channels, resulting in the total loss of data or the reception of false data by those receivers corresponding to the channels in which the interference occurs.

It is well known in the art that intermodulation of data signals between several frequency channels is caused, at least in part, from the non-linear response characteristics of the signal receiving AGC circuits when subjected to signals of large amplitude. This intermodulation and distortion can generate false signals at frequencies to which individual receivers are sensitive, with the result that the desired signals are overridden by the false ones in the one or more amplifiers.

Thus, a need exists for a new and improved automatic linear gain control circuit and system which can be used to control the amplitude of data signals presented to a receiver and which substantially eliminates the aforementioned frequency intermodulation products and distortion problems inherent in systems of the preceding type to ensure that data is accurately received.

DESCRIPTION OF THE PRIOR ART

Automatic gain control circuits are well known in the art, and there are many designs of such circuits for use in various systems. In frequency multiplexed systems of the type in which the invention is particularly advantageous, these circuits, for the most part have been constructed from purely analog devices.

To the best of this inventor's knowledge, however, the use of digital logic in automatic gain control (AGC) systems has been quite limited. One known system employing digital logic in non-automatic gain control is disclosed in U.S. Pat. No. 4,151,481, entitled Digital Gain Control System.

U.S. Pat. No. 4,151,481 describes an audio volume control system for a television set wherein volume changes are initiated by a legally-generated acoustic signal. In that system, an acoustic signal of one frequency causes an increase in audio volume while a signal of a second frequency causes a decrease. This is accomplished by each signal's activating clock oscillator, which in turn causes a counter to count up or down, depending on which of the two acoustic signals is received. The counter is coupled to a digital to analog (D/A) converter which develops an analog output signal proportional to the digital output of the counter. The output of the D/A converter is coupled to the DC gain control terminal of a variable gain audio amplifier through a control signal developing means to thus control the gain of the amplifier. An audio signal is applied to a separate input terminal of the amplifier. The system described in this patent does not provide automatic gain control of the sort required in a communication receiver.

The aforedescribed gain control system operates in a somewhat analogous fashion to all known prior art systems. That is, an analog control current is developed in one way or another for actually controlling the gain of an amplifier. While these types of systems satisfactorily operate linearly over a small range in signal amplitude, it appears that they do not have any means of preventing the problems of distortion or of eliminating the previously mentioned frequency intermodulation products which occur when signals of several frequencies and of large varying amplitude are applied to a receiver. Thus, to overcome these problems, a gain control system is needed which provides the capability of operating over a wide dyanmic range in input signal amplitude and which can further control the amplitude of the input signal over a large linear range to eliminate distortion and/or the generation of frequency intermodulation products found to be inherent in many types of communication system receivers.

SUMMARY OF THE INVENTION

The aforementioned problems are overcome with the present invention by the provision of a digital gain control system and method which operates on the principle of digital signal attenuation for automatic gain control, rather than direct DC gain control of an amplifier.

A controllable logic attenuator receives input signals of at least one frequency which vary over a large range in amplitude. The output of the logic attenuator provides the input signals to a threshold detector means which generates at least one control signal when the amplitude of the input signals are outside a prescribed threshold level. A digitally operable attenuator control responds to the control signal and to clock signals to provide binary signals to the logic attenuator to effect an attenuation in the amplitude of the input signals to a prescribed threshold level determined by the threshold detector means.

The output of the logic attenuator provides signals of substantially constant amplitude useful, for example, in feeding a conventional mixer, IF filter and amplifier. By attenuation of the input signals to a prescribed level, and in a prescribed manner, a very wide dyanmic range automatic gain control circuit is provided, one which is inherently linear and which prevents the introduction of inter-modulation and distortion into elements of the system. These elements are typically mixers and IF amplifiers.

In view of the foregoing, it is therefore an object of the present invention to provide an economical design for an automatic digital gain control system having enhanced operating capabilities.

It is another object of the present invention to provide a digital gain control circuit and system capable of receiving signals varying over a wide range in amplitude wherein the amplitude of those signals is linearly attenuated to eliminate distortion of the signals.

A still further object of the invention is to provide a digital gain control circuit for use in a multi-channel frequency multiplex data communication system capable of linearly attenuating input data signals of several channel frequencies which vary over a wide range in amplitude to attenuate the amplitude of the input data signals to eliminate channel frequency inter-modulation products generated by the several channel frequencies, whereby each channel frequency can accurately be received.

BRIEF DESCRIPTION OF THE DRAWING

The preceding objects and other objects and advantages of the invention will be better appreciated by reading the following detailed description of the embodiments of the invention, particularly when considered with the accompanying drawing in which.

DESCRIPTION OF THE PREFERRED EMBODIMENT

Prior to describing the embodiments of the invention, it is first considered advantageous to briefly describe how the aforementioned frequency intermodulation products are generated in a frequency multiplex system.

To understand the generation of these products, it is first necessary to assume a data communication link wherein several closely separate frequencies (eg., freqiencies $f_o$, $f_1$-$f_n$) are simultaneously transmitted over the communication link. It should also be assumed that at least two of these frequencies will be very high in signal amplitude compared to at least one other frequency of much smaller amplitude. Additionally, assume that each of the several frequencies represents a separate data channel containing information to be simultaneously received be separate receivers or mixer IF filter amplifiers tuned to receive data at their corresponding channel frequencies.

It is well known in the art that when a complex wave comprised of several separate frequencies is presented to the input of a non-linear device, that the sum of two of these frequencies can generate other frequencies. This can be explained by plotting $e_{in}$ (as the sum of two or more frequencies or waves) as the input to a non-linear device against $e_{out}$ (the output of the non-linear device). This plot will yield the following polynomial of a non-linear curve:

$$e_{out} = A_0 + A_1 e_{in} + A_2 e_{in}2 + A_3 + e_{in}3 + \qquad (1)$$

Where $A_0$, $A_1$,-$A_n$ are constants that describe the characteristics of the non-linear device.

Suppose, for example, that the input voltage is a sum of two angular frequencies, $w_1$ and $w_2$:

$$e_1 = \sin w_1 t + \sin w_2 t \qquad (2)$$

Substituting this sum for $e_1$ in the cubic term of expression (1) above, and simplifying by ignoring all phase angles, gives the following result:

$$(e_{out}) \text{ cubic} = k_1 \sin 3 w_1 t + k_2 \sin (2w_1 + w_2)t + k_3 \sin (2w_1 - w_2)t + k_4 \sin (2w_2 + w_1)t + k_5 \sin (2w_2 - w_1)t + k_6 \sin 3w_2 t \qquad (3)$$

The intermodulation products represented by frequencies $(2w_1-w_2)$ and $(2w_2-w_1)$ are created by the non-linearity.

Thus, it can be seen that the sum of two or more frequencies combine to generate an ascending order of frequencies (intermodulation products), some of which may be the same as the desired signal frequencies and of comparable amplitude. As previously mentioned, these intermodulation products or frequencies are due to the non-linear response of the device receiving the several multiplexed frequencies or signals. It is this non-linearity which must be eliminated in order to minimize the interfering effects that the intermodulation products or frequencies have on receivers or amplifiers in a communication system of the type contemplated by the present invention.

It is also known in data communication systems, even in systems of the single channel type wherein only one carrier frequency is transmitted, that signals of excessive amplitude can cause distortion in a receiver or receiving amplifier if that signal is not adequately attenuated prior to being received by the receiver or amplifier. Thus, the present invention also contemplates a completely linear automatic gain control system for use in single channel communication systems as well as multiplex communication systems for reducing the inherent distortion effects that can be caused by signals of high amplitude.

Figure 1:
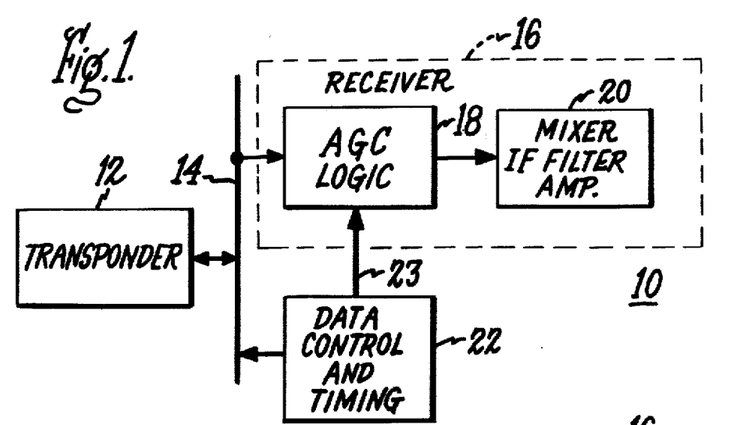
FIG. 1 a major block diagram of one embodiment of the invention.

With the foregoing description in mind, reference is now made to FIG. 1 which illustrates a data communication or automatic gain control (AGC) system generally designated 10. In the embodiment of FIG. 1, a transponder or signal source 12 is shown generating output signals via a data communication link or bus 14, such as an RF communication link, or wired system for input to an automatic gain control (AGC) logic 18 of a receiver 16. As will subsequently be described, the AGC logic 18 contains all of the necessary electronic circuitry to attenuate input signals applied to the logic to substantially maintain the output signals from the AGC logic 18 at a substantially constant level for input to a conventional mixer IF filter amplifier 20. As previously mentioned, if the input signals from link 14 to the AGC logic 18 are comprised of several closely related frequencies, wherein the amplitude of two or more of those frequencies is excessively high compared to at least one other frequency, unwanted voltages or intermodulation products are generated at the desired frequency to which the mixer IF amplifier 20 is tuned due to non-linear circuit elements. Additionally, if only a single frequency of excessive amplitude is received it can create an output signal from the AGC logic 18, if not adequately attenuated, which can introduce distortion into the mixer IF filter amplifier 20 due to over saturation of the amplifier. It has been found through experience that if the signal level from the output of AGC logic 18 can be limited, for example to approximately 0.1 volts, then intermodulation or distortion in other elements of the system (typically mixers and IF amplifiers) will be within tolerable limits.

In the embodiment of FIG. 1, a data control and timing means 22 is illustrated as providing control and/or timing signals to the AGC logic 18 via conductors 23. The purpose of these timing and/or control signals will subsequently be described in connection with the following detailed description of the invention. The control and timing means 22 also interfaces to the communication link 14 to provide interrogation signals to the transponder 12, if the system is of the type wherein the transponder must respond to a command prior to transmitting data to the AGC logic 18.

Figure 5:
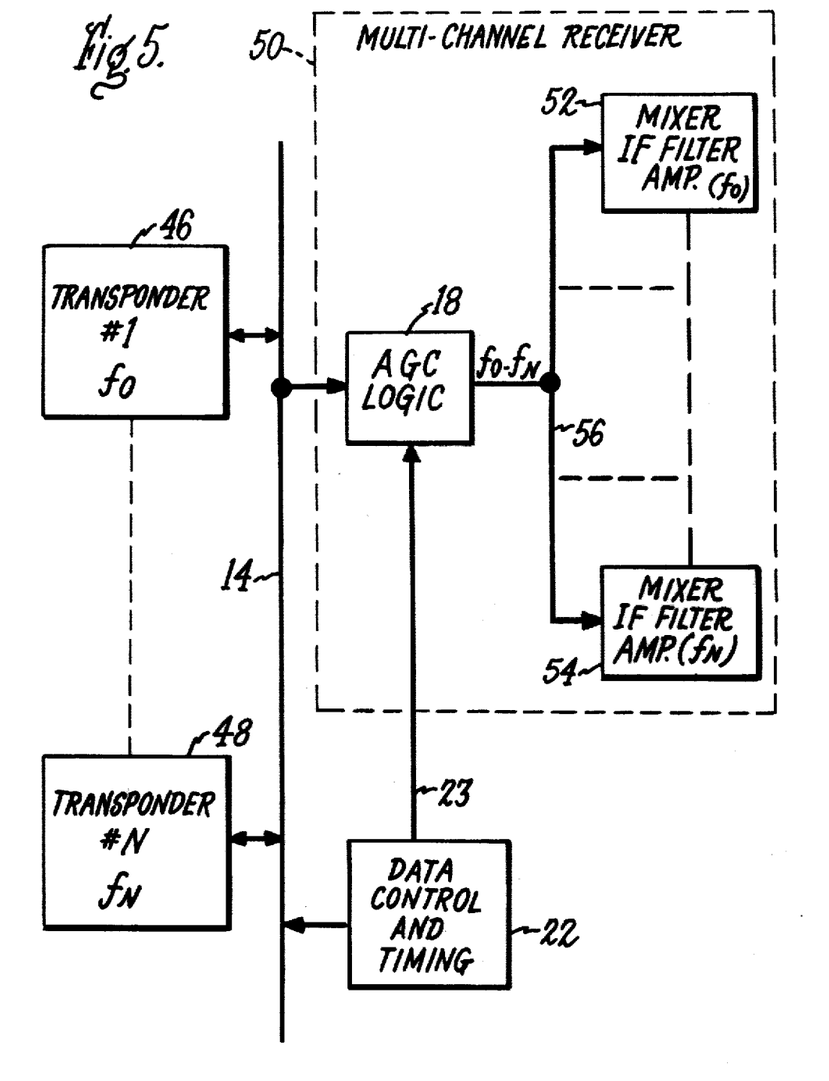
FIG. 5 is a major block diagram of a second embodiment of the invention illustrating a multi-channel receiver utilizing the AGC logic of FIGS. 1, 2 and 3.

While the invention has application in most any type of data communication system, whether it be through RF communication link, or hard wired link, it finds particular application in powerline communication systems wherein commands and data are transmitted over a 120/240 volt 60 Hz powerline carrier link. One such system for transmitting data over a powerline is disclosed in U.S. Pat. No. 4,107,656 entitled "Data Communication Receiver and Transfer Apparatus" assigned to the assignee of the present invention. In that patent, the transponder 12 is identified as several meter terminal units 20 which simultaneously receive interrogation signals or commands from a section control unit similar to the data control and timing 22 via power lines 18. Upon the decoding of a command by the meter terminal units 20, they each simultaneously reply with a separate frequency comprised of multiplexed frequency data signals of eight modulated carrier signals for input to a section control unit, which may comprise the receiver 16 of FIG. 1. In the section control unit of that system, eight receivers must be able to distinquish between eight different frequencies which are simultaneously transmitted over a communication path such as link 14. While not shown in FIG. 1, it can well be understood that more than one mixer IF filter amplifier 20 may be included in the receiver 16. An example of a receiver of this type is shown in FIG. 5 to subsequently be described.

Figure 2:
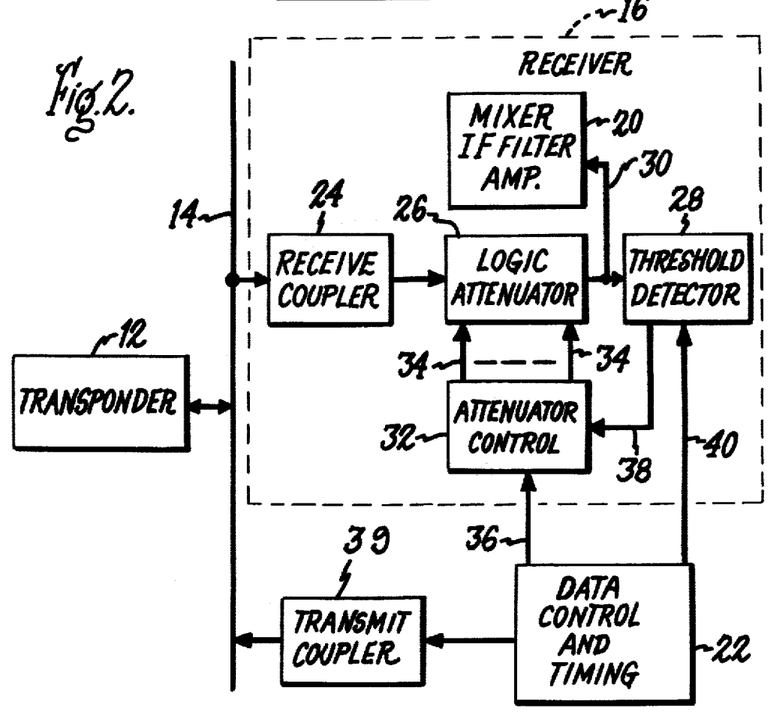
FIG. 2 is an intermediate block diagram schematic of the embodiment of FIG. 1 showing in greater detail the structure of the receiver and automatic gain control (AGC) logic of that embodiment.

Reference is now made to FIG. 2 wherein elements corresponding to equivalent elements in FIG. 1 carry the same number identifications. Further, throughout the several figures to be described subsequently, like elements carry like numbers. FIG. 2 represents in more detailed logic block diagram form the receiver 16 of FIG. 1. Particularly, the AGC logic 18 is expanded to include a receive coupler 24 for receiving input data via link 14. The output of the receive coupler provides the input data signals to a digital logic attenuator 26 which is controlled by binary signals via a plurality of conductors 34 from a digital attenuator control logic circuit 32. The input data signals to the logic attenuator 26, under control of the digital signals 34, are incrementally attenuated in a manner to be subsequently described for input to a threshold detector 28 via conductors 30.

The thresold detector 28 continuously monitors the output signals from the logic attenuator 26 and provides a count control or enable output signal via a conductor 38 to the attenuator control 32. Whenever the amplitude of the input signals from the logic attenuator 26 to the threshold detector 28 are above a predetermined threshold level, the threshold detector 28 generates the enable output control signal on conductor 38. The control signal on conductor 38 allows the attenuator control 32 to change the states of the binary output signals 34 applied to the logic attenuator 26. The binary value, or weight, of the signals on conductors 34 cause the logic attenuator 26 to increase the attenuation of the input signals applied thereto to bring the input signals to the threshold detector 28 within the prescribed threshold level. When the signals applied to the threshold detector 28 are within the prescribed threshold level, the attenuator control 32 is inactivated, leaving the binary states on conductors 34 constant to thereby maintain the output of the logic attenuator 26 at the set threshold level. Thus, the output of the logic attenuator, applied to the mixer IF filter amplifier 20, is maintained at a sufficiently low signal amplitude to prevent distortion and/or intermodulation products from interfering with that amplifier's receiving the input data signal at its tuned frequency.

Also shown in FIG. 2, is the data control and timing 22 which provides control signals to the attenuator control 32 via conductors 36 and timing or clock signals to the threshold detector via conductor 40. The exact purpose of these signals on conductors 36 and 40 will be subsequently described. As also shown in FIG. 2, the data control and timing 22 provides interrogation signals or commands to the transponder 12 via a transmit coupler 39 and the communication link 14. The transmit coupler may be a conventional transformer with LC circuitry for coupling RF signals onto the communication link 14.

Figure 3:
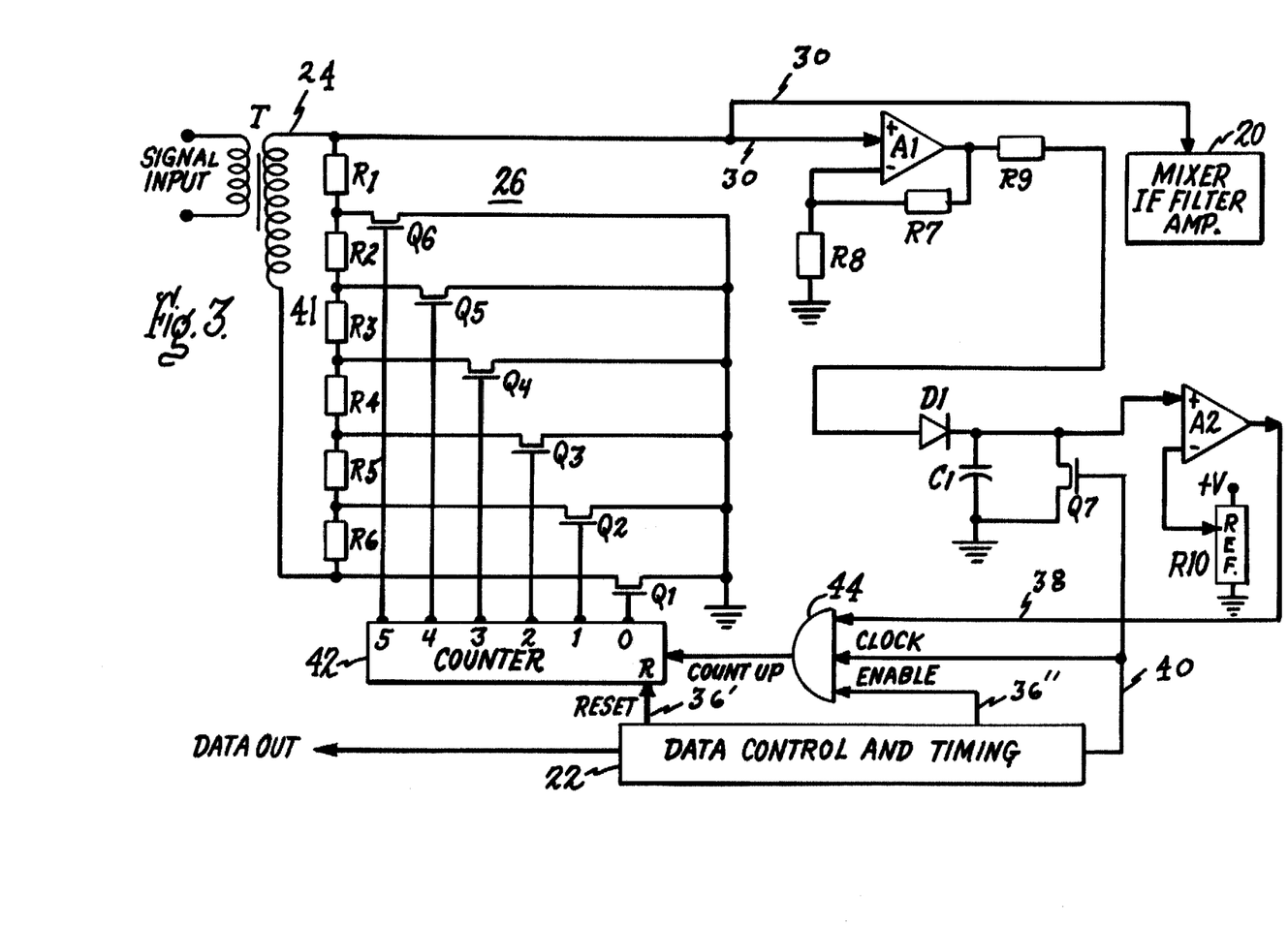
FIG. 3 is an electrical schematic logic diagram of the receiver and AGC logic of FIG. 2.

Reference is now made to FIG. 3, which shows in detail the AGC logic of the receiver 16 of FIGS. 1 and 2. In FIG. 3, the receive coupler 24 is shown as a conventional coupling transformer T receiving the input data signals via the bus 14. The input data signals are coupled from the primary to the secondary of the transformer T into the logic attenuator 26. Prior to describing the embodiment of the logic attenuator 26 as shown in FIG. 3, reference is first made to FIG. 4, as that embodiment shows an exemplary simplified version of how the logic attenuator 26 functions in the system of the present invention.

Figure 4:
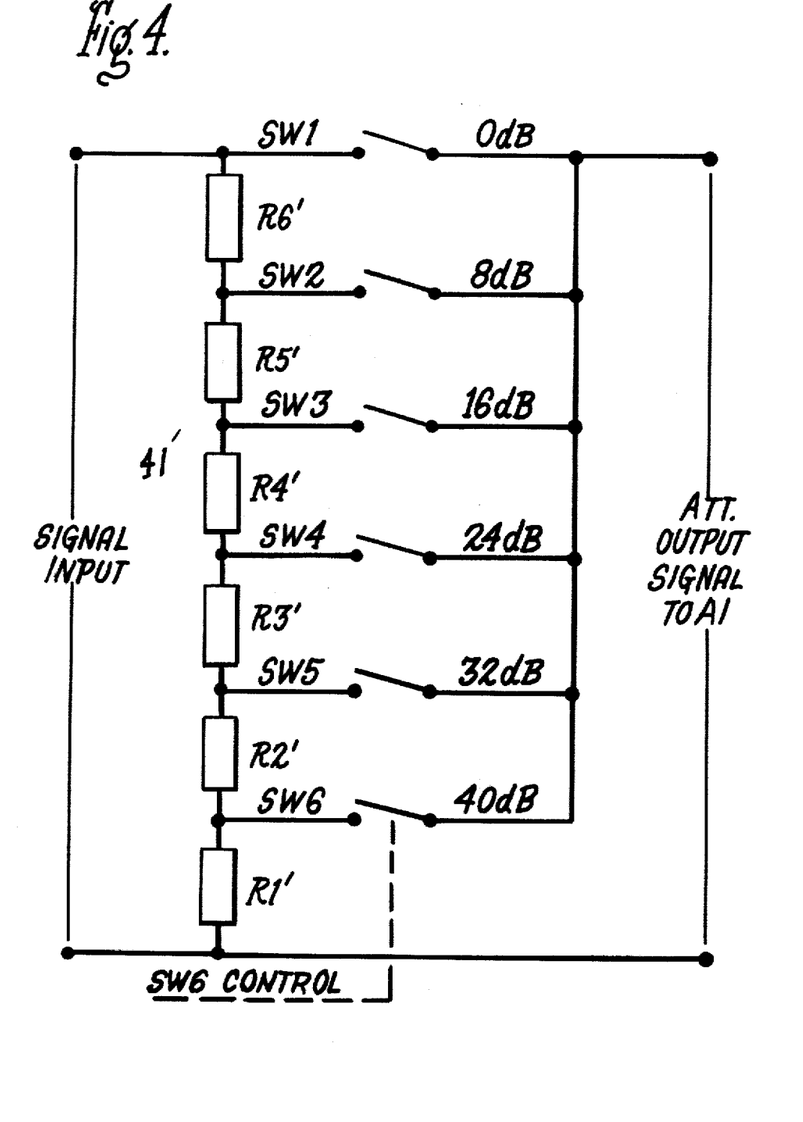
FIG. 4 is an exemplary schematic of a logic attenuator useful in understanding the operation of the invention.

As shown in FIG. 4, the input signals from the transformer T or coupler 24 are applied across a gain control element 41' comprised of a tapped resistor chain of resistors R1' through R6'. A series of single pole signle throw switches designated SW1 through SW6 are connected in a voltage divider fashion into the resistor chain with SW1 being connected at the top end of resistor R6' and switches SW2 through SW6 connected at the junctions of other resistors in the chain. To simplify the drawing of FIG. 4, only one switch control is shown, and that is illustrated by a dashed control line applied to SW6. It should be understood, however, that a separate control may be applied to each of the other switches SW1 through SW5.

As shown in FIG. 4, all of the switches are in the open position, thus no data input signal can appear at the output of the logic attenuator. Let it now be assumed that a control signal closes switch SW1. As can be seen, the input signal applied to the logic attenuator will now pass directly through the logic attenuator with 0 dB attenuation. As shown in FIG. 2, the input signals from the logic attenuator 26 are passed directly to the threshold detector 28 and to the mixer IF filter amplifier 20. If these input signals are of excessive amplitude, it is thus desirable to attenuate those signals down to a suitable level to eliminate the previously mentioned intermodulation frequency products and also to prevent any distortion of the signal which may occur in the mixer IF filter amplifier 20. In the embodiment of FIG. 4, the resistors R1' through R6' are of suitable values to attenuate the input signal in eight dB steps from 0 dB to 40 dB. It is to be understood, however, that the maximum attenuation of 40 dB is merely exemplary. It can be seen that it would be just as easy to design a chain of resistors which could start from 0-100 dB or to some greater value. The number of resistors and switches employed in the system of the logic attenuator 26 is directly dependent upon the system design and the amount of control desired in the system, commensurate with the maximum known amplitude of the input signals applied to the logic attenuator 18.

Still referring to FIG. 4, to attenuate the input signals to the attenuator in an incremental fashion, it can be seen that if SW1 is open and SW2 is closed, the attenuator output signal is attenuated by an increment of 8 dB due to the voltage drop across resistor R6'. In a similar fashion, if it is desirable to attenuate the output signal by 16 dB, SW1 and SW2 are opened and SW3 is closed. The voltage drop of the input signal across R6' and R5' will now effect a 16 dB drop in signal level or attenuation. It can be seen be referring to the remainder of the switches, how through incrementally closing one switch at a time and opening all other switches, that the input signal can be incrementally attenuated from 0 to 40 dB. It can also be seen that the attenuator can be made to decrease attenuation from 40 dB down to 0 dB by merely consecutively opening and closing the respective switches starting from SW6-SW1.

Reference is now made back to FIG. 3, which is a schematic logic diagram showing in detail the AGC logic 18 of the receiver 16. As shown in FIG. 3, the preferred embodiment for the logic attenuator 26 is comprised of a gain control element 41 having a chain of resistors R1 through R6 connected across the secondary of the input coupler transformer 24. The input signals from coupler 24 are applied to a non-inverting or positive (+) input terminal of a conventional operational amplifier designated A1 and also to the mixer IF filter amplifier 20 via conductors 30. Also making up part of the attenuator 26 in FIG. 3, are a plurality of electronic switches shown as field effect transistors (FET's) Q1 through Q6. In operation, these transistors take the place of the switches SW1 through SW6 previously described in connection with FIG. 4. It will be noted that each of the FET's Q1 through Q6 have their respective drain electrodes connected to a common potential shown as ground and their source electrodes connected at the junctions of R1-R6. The following Table 1 illustrates the operation of the attenuator 26 for the various binary states of the counter 42. The left hand six columns designate the counter stages C0-C5 of counter 42 and their corresponding relationship to the FET's Q1-Q6. The binary 0's and 1's in the respective columns illustrate the states of stages C0-C5 for the various amounts of dB attenuation. A binary 0 means a particular stage is reset, whereas a binary 1 means that a stage is in the set state. The remaining column of Table 1 shows the amount of attenuation for the various counts or states of the counter 42.

TABLE 1

|  | C0<br>Q1 | C1<br>Q2 | C2<br>Q3 | C3<br>Q4 | C4<br>Q5 | C5<br>Q6 | dB ATT |
|---|---|---|---|---|---|---|---|
|  | 0 | 0 | 0 | 0 | 0 | 0 | OPEN |
|  | 1 | 0 | 0 | 0 | 0 | 0 | 0 |
| Counter | 0 | 1 | 0 | 0 | 0 | 0 | 8 |
| States | 0 | 0 | 1 | 0 | 0 | 0 | 16 |
|  | 0 | 0 | 0 | 1 | 0 | 0 | 24 |
|  | 0 | 0 | 0 | 0 | 1 | 0 | 32 |
|  | 0 | 0 | 0 | 0 | 0 | 1 | 40 |

As indicated in Table 1, when the counter 42 is reset the attenuator 26 is open, thus isolating the receiver 16 from receiving any data signals via the link 14. This isolation is due to the fact that Q1-Q6 are all turned off. Thus, no ground reference is provided for the input voltage on conductor 30 applied to amplifier A1.

In the embodiment of FIG. 3, when transistor Q1 is turned on, or in the conducting state, it represents a 0 dB attenuation of the input signals applied to the amplifier A1. The signal applied to the + input of amplifier A1 is sequentially attenuated in 8 dB increments, up to 40 dB, by first turning on Q1, then turning on Q2 while simultaneously turning off Q1 and repeating the process of turning on Q3 and turning off Q2 etc. until maximum attenuation is achieved with Q6 turned on and Q5-Q1 turned off. In one embodiment of the invention, the actual values of resistors R1 through R6 chosen to provide the 8 dB incremental attenuation steps are as follows:

| R1 | 60k |
|---|---|
| R2 | 24k |
| R3 | 9.7k |
| R4 | .38k |
| R5 | 1.5k |
| R6 | 1k. |

Still referring to FIG. 3, the counter 42 is conventional, such as a Johnson counter, having binary stages or output terminals 0 through 5 connected to associated gate input terminals of Q1 through Q6 as shown. By observation of FIG. 3, it can be seen that when counter 42 is in the reset state, all of the transistors Q1 through Q6 are turned off, thus opening the ground return path for the secondary of coupling transformer 24 and R1–R6, to isolate the receiver 16 so that input signals can't be received. When stage 0 of counter 42 is set to a binary 1, transistor Q1 turns on, thus completing the ground path for the coupler 24. Under this condition, any input signals applied to the coupler will then be applied completely unattenuated to the + input of amplifier A1.

As the counter is counted up, the binary 1 in stage 0 of the counter will be shifted into state 1 of the counter, thus turning off Q1 and turning on Q2. Under this condition, the input signal will be attenuated by 8 dB due to the voltage drop across R6. In a similar fashion, as the binary 1 continues to progress through stages 2, 3, 4 and 5 of the counter to sequentially turn on and off Q3–Q6, the output signal of the attenuator will be incrementally attenuated by 16, 24, 32 and 40 dB respectively.

Reference is now made back to the operational amplifier A1. Amplifier A1 is connected as a conventional operational amplifier in feedback configuration having a resistor R7 connected from its output back to a negative (−) or inverting input. Also connected at the junction of the (−) input and one end of resistor R7 is a resistor R8 connected to ground. The output terminal of amplifier A1 is connected via a coupling resistor R9 to the input of an amplitude detector circuit designated diode D1. The detector also includes a switchable integrator circuit comprised of a capacitor C1 connected from the cathode of D1 to ground in conjunction with a field effect transistor Q7. The drain electrode of transistor Q7 is connected to ground in common with the capacitor C1, whereas its source electrode is connected to the other side of the capacitor C1 at the cathode end of D1. The rectified and integrated output signals from the detector D1, C1, Q7 is applied to a non-inverting or positive (+) input terminal of a second operational amplifier or comparator A2. Amplifier A2 comprises a threshold detector which receives a reference voltage from a reference resistor R10 connected between a potential source shown as ground and a positive voltage shown as +V at its inverting or negative (−) input terminal. The output terminal of amplifier A2 provides a count control signal via conductor 38 to a gating element shown as an AND gate 44 serving as a means for providing a count up signal to the input of counter 42.

The data control and timing 22, again illustrated in FIG. 3, provides a reset control signal on a conductor 36′ to a reset (R) terminal of counter 42. Also, the data control and timing 22 provides an enable signal to gate 44 on a line 36″. Clock signals, via line 40, are provided to the gating element 44 as well as to the gate electrode of transistor Q7 to operate the gate 44 and the switchable integrator circuit in a manner to be described. Also, the data control and timing provides output data or commands to the transmit coupler (See FIG. 2) for transmission on to the communication link 14.

In describing the present invention, the data control and timing 22 are not shown in detail as the logic design for generating the reset, enable and clock signals is considered to be elementary to one of ordinary skill in the art. A representative example of a design for generating the reset, enable and clock signals is an Intel 8080 microprocessor. This microprocessor can readily be programmed to provide appropriate output signals having the proper timing relationships. Additionally, these types of microprocessors are capable of storing data, and under program control, transmitting that data out over a communication bus such as link 14.

To understand the operation of the AGC circuit and system of FIG. 3, it must first be understood that the input signals applied to coupler 24 are in the form of a complex wave of several discrete frequencies of which the signal amplitudes of at least two frequencies are much greater than the other frequencies. Also, the threshold or reference voltage from resistor R10 to the (−) input of threshold detector A2 is set at some predetermined value, whereby the output of detector A2 will always be a binary 1 whenever the input signals applied to the (+) terminal of A2 are in excess of the threshold level. Further, detector A2 will provide a binary 0 output so long as the input signals to the (−) input terminal are equal to or less than the threshold voltage.

Figure 6:
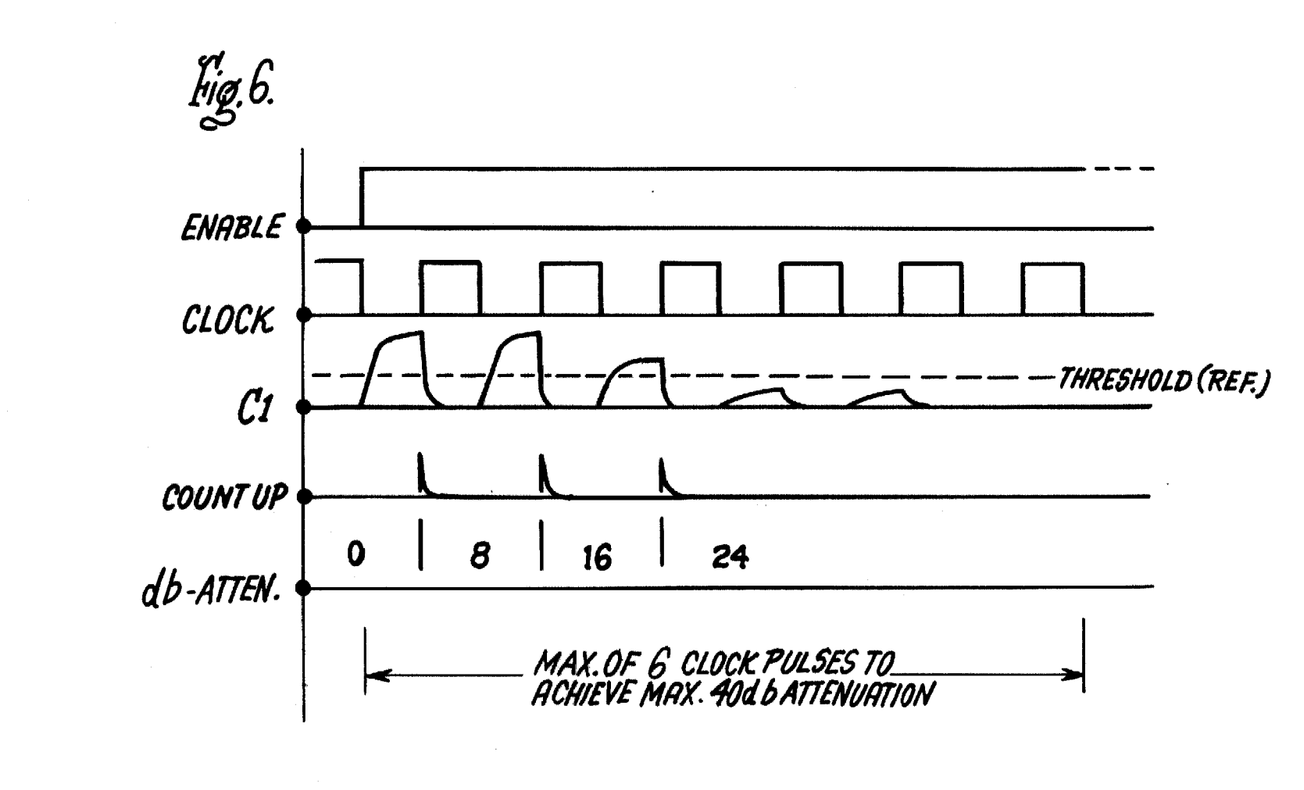
FIG. 6 is a timing diagram useful in understanding the operation of the invention as shown in FIG. 3.

Reference is now made to FIG. 6 in conjunction with FIG. 3. In the embodiment of FIG. 3, the coupler 24 will receive input signals only when the transponder 12, as shown in FIGS. 1 or 2, is commanded to do so from the data control and timing 22. To understand the operation of FIG. 3, it should first be assumed that a command from data control and timing 22 is transmitted to the transponder 12 causing that transponder to thus send back data signals to the input of the coupler 24. To condition the circuit of FIG. 3 in preparation to receiving input data signals from the transponder 12, a binary 1 enable gate signal on line 36″ is provided to one input of gate 44 from the control and timing 22 (See FIG. 6). Also, at the same time the enable signal is generated, a reset pulse on line 36′ (not shown in FIG. 6) is applied to counter 42. This reset signal preferably resets stages 1 through 5 and presets a binary 1 into stage 0 of counter 42, thus turning on transistor switch Q1 and turning off Q2–Q6. It will be noted, that the logic attenuator 26 is set to 0dB attenuation just prior to receipt of the data signals by turning on Q1. In operation, the receiver or AGC circuit of FIG. 3 sees at one moment no signal at all, then sees at another moment all of the multiplexed signals simultaneously.

Referring to FIG. 6, it will also be noted that the clock signal from the data control and timing 22 is generated during the period of the enable signal. The clock signal is a continuous running clock which operates from the data control and timing so long as the enable signal is present. With the counter 42 now setting the attenuator at 0dB attenuation (Q1 conducting), let it be assumed that the input signals applied to amplifier A1 are thus amplified and applied to the detector integrator circuit D1, C1 and Q7. These signals are rectified by D1 and applied to the input of threshold detector A2. Assuming now that the input signals are above the threshold reference established by R10, capacitor C1 will charge in a fashion as shown in FIG. 6 to some level above the threshold reference. It should be noted that capacitor C1 is allowed to charge to the amplitude of the input signal during the negative transition of the clock signals, or while the clock is in the negative or binary 0 state. As the voltage on C1 achieves or exceeds the threshold level, the output of detector A2 on line 38 will achieve a binary 1 state enabling the second input to gate 44. On the first positive transition of the clock signal on line 40, gate 44 will now be enabled to generate a count up pulse as shown in FIG. 6, thus causing counter 42 to turn off Q1 and turn on Q2 by changing stage 0 of counter 42 to a binary 0 and setting stage 1 to a binary 1. Also at this time, Q7 is turned on to rapidly discharge C1 as shown in FIG. 6. The input signals applied to amplifier A1 have now been attenuated by 8 dB due to the voltage drop appearing across resistor R1 which is presently connected through Q2 back to ground. As shown in FIG. 6, when the clock signal goes negative, Q7 is turned off and capacitor C1 will again charge up to the amplitude of the input signal applied to D1. Upon the next positive transition of the clock, the counter will again be stepped to now turn on transistor Q3 and turn off transistor Q2. Thus, 16 dB of attenuation is inserted by the logic attenuator 26 due to the voltage drop occurring across R1 and R2 through Q3 to ground. This 16 dB is reflected as shown by the third C1 pulse of FIG. 6 where the charge on capacitor C1 is now much lower than at 8 dB, but still above the threshold reference. As shown in FIG. 6, the third count up pulse applied to counter 42 from gate 44 inserts 24 dB of attenuation by resetting stage 2 and stage 3 of counter 42 to turn off Q3 and turn on Q4. As shown, the voltage on capacitor C1 now remains below the threshold reference. In FIG. 3, the 24 dB attenuation now inserted is due to the voltage drop across the series connected resistors R1, R2 and R3 through transistor Q4 to ground.

As shown in FIGS. 6 and 3, it takes a maximum of six clock pulses to achieve a maximum of 40 dB attenuation by the attenuator 26. This maximum, of course, occurring when Q6 is turned on with Q1 through Q5 turned off. This creates a voltage drop proportional to 40 dB across the series connected resistors R2 through R6 through Q6 to ground.

Significant in the operation of the embodiment of FIG. 3 is that the resistor chain for the logic attenuator 26 is set at 0 dB attenuation in advance of the receipt of input data signals through the coupler 24. When the signals are received, the output of the logic attenuator is then amplified through amplifier A1, detected through D1 and compared in threshold detector A2 against the reference from resistor R10. If the input data signal, as conditioned by the detector and switched integrator D1, C1, Q7, has an amplitude higher than the reference voltage, a step of attenuation continues until the conditioned signal at the input of detector A2 is equal to or below the reference set by R10. When the conditioned signal is equal to or below the reference, the output of A2 remains at a binary 0 state, disabling gate 44. Thus, counter 42 is prevented from counting and the automatic gain control circuit is left at the appropriate attenuation level. After the message data or input signals have been received, as determined by the data control and timing 22, the counter 42 may be reset by setting stage 0 of the counter to a binary 1 and stages 1 through 5 to binary zeros to receive another message.

Reference is now made to FIG. 5, which shows in block diagram from a multi channel receiver 50 similar to that described in connection with FIGS. 1, 2 and 3. However, the multi channel receiver 50 contains a plurality of mixer IF filter amplifiers designated 52 through 54. In this embodiment of the invention, the AGC logic 18 operates in the same manner as that just described for FIG. 3. Also, shown in the embodiment of FIG. 5, is a plurality of transponders 46 through 48 similar to transponder 12 of FIGS. 1 and 2 connected to the communication link 14. It will be noted that each of the transponders 46 through 48 generates a unique output signal, such as one of carrier frequencies $f_0$ through $f_n$. In this embodiment, when the data control and timing 22 transmits a command onto the communication link 14, each of the transponders 46 to 48 simultaneously responds at its own frequency. These frequencies are thus multiplexed onto the communication link 14 and received by the AGC logic 18. The AGC logic 18, operating in the manner as just described in connection with FIG. 3, will incrementally attenuate the input signals providing output signals $f_0$-$f_n$ for input to each of the mixer filter amplifiers 52 through 54 via the communication lines 56. The output signals $f_0$ through $f_n$ from the AGC logic 18 are thus properly conditioned in amplitude to allow each of the mixer amplifiers 52 through 54 to receive their respective input signals in accordance with the frequency to which each of those amplifiers is tuned. By so conditioning the amplitude of the output signals from the AGC logic 18 to the proper level, the aforementioned intermodulation products and distortion are eliminated in the amplifiers 52-54, thus allowing each of them to operate linearly over a reasonable signal range.

Figure 7:
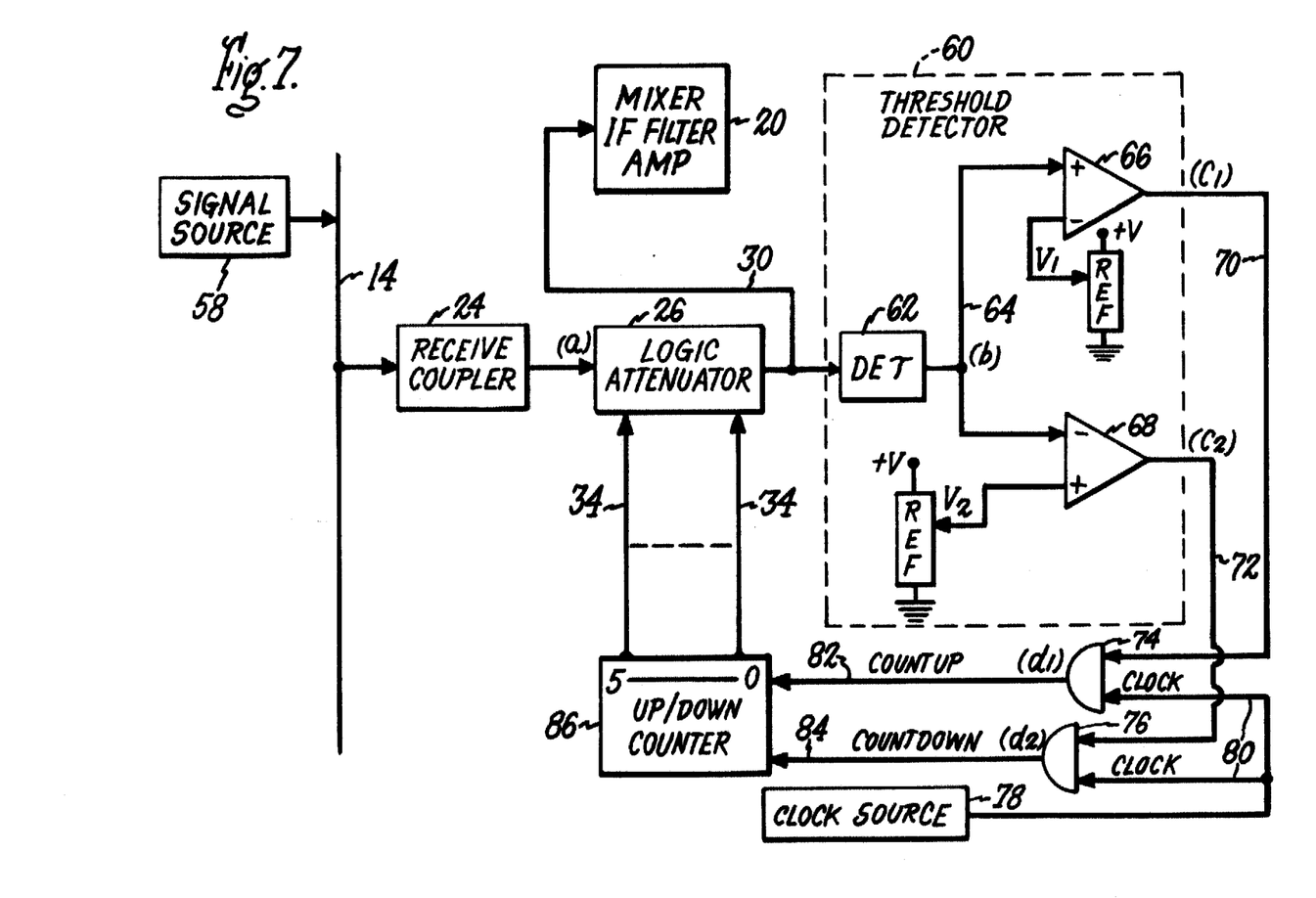
FIG. 7 is an electrical schematic logic diagram of a receiver and AGC logic of a second embodiment of the invention.
Figure 8:
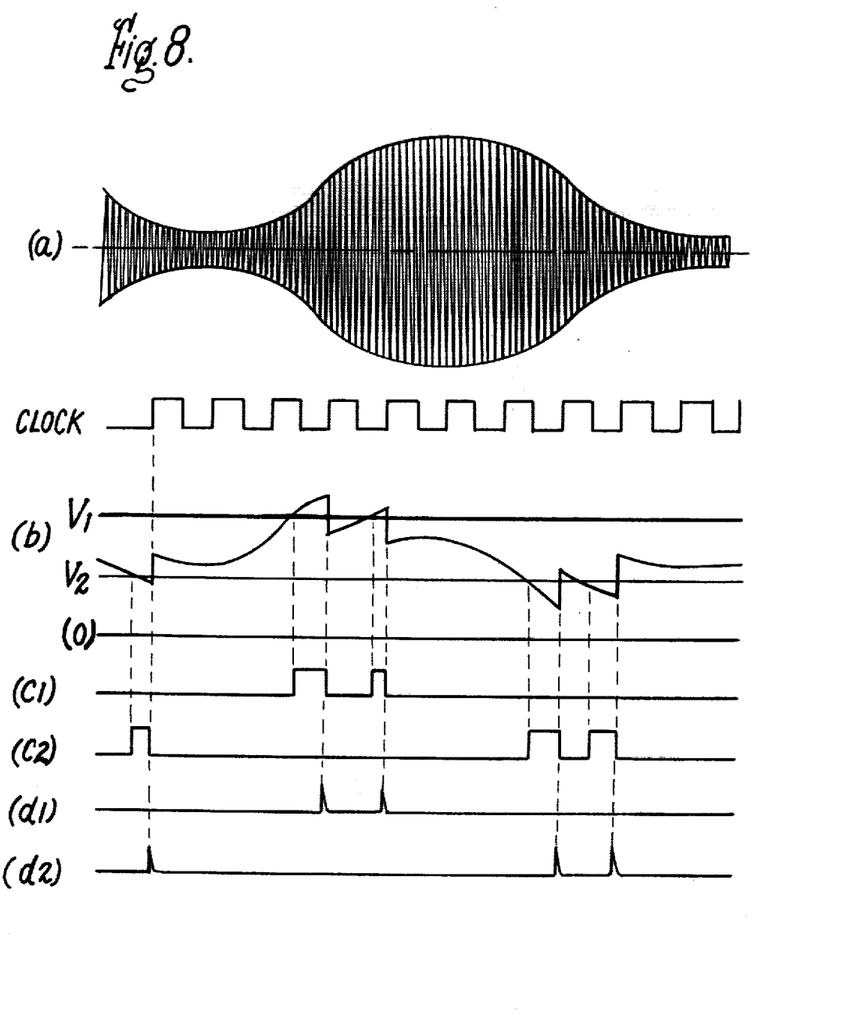
FIG. 8 is a timing diagram useful in understanding the operation of the embodiment of FIG. 7.

Reference is now made to FIG. 7, which illustrates another embodiment of the present invention. This embodiment illustrates a totally variable gain receiver which operates linearly over signal input amplitudes of large varying magnitude. A signal source 58, such as an RF signal generating station, is illustrated as providing a modulated input signal to the receive coupler 24 via the communication link 14. The signal generated by the signal source 58 is illustrated in FIG. 8 as (a) at the output of the receiver coupler 24. For purposes of simplification to illustrate the operation of the invention, the RF signal (a) as illustrated, has a large but undesired amplitude variation. The receive coupler 24 provides the input signal (a) to the logic attenuator 26, the output of which is provided to the mixer IF filter amplifier 20 via line 30 and also to the input of a conventional amplitude detector 62. It may be desirable to include in the detector 62, an amplifier, such as A1 of FIG. 3, to amplify the input signal to the detector. In this embodiment, the detector 62 does not receive the clock pulses to a switchable integrator as previously described in connection with FIG. 3.

The detector 62, which is part of a threshold detector 60, provides an output signal (b) to two threshold detectors or comparator amplifiers 66 and 68 via lines 64. The amplifier 66 receives the input signal (b) at a (+) or non-inverting input terminal, whereas the amplifier 68 receives the input signal (b) at a (−) or inverting input terminal. As shown in FIG. 7, each of the amplifiers 66 and 68 receives a threshold or reference voltage from a corresponding reference potentiometer similar to R10 as previously described in connection with FIG. 3. Amplifier 66 receives a reference voltage V1 at its (−) input terminal, whereas amplifier 68 receives a reference voltage V2 at its (+) input terminal. As shown on signal line (b) of FIG. 8, the reference voltages V1 and V2 are adjusted with some prescribed voltage span between the two voltages, with V1 being adjusted at some potential slightly positive with respect to V2. Also, it should be noted that V1 and V2 are adjusted at some voltage above a zero (0) potential reference such as ground.

An output signal ($C_1$) from amplifier 66 on a conductor 70 is applied as one input to a combining or gating means 74 along with a clock signal on conductor 80 from a clock source 78. In a similar fashion, the output of amplifier 68 provides a signal ($C_2$) on a conductor 72 as one input to a second gating element 76 receiving at its other input a clock signal from the clock source 78. When the gating elements 74 and 76 are enabled, they will selectively provide count-up and count-down pulses (d1) and (d2) on conductors 82 and 84 respectively to a conventional up/down counter 86. The (d1) and (d2) pulses control the up/down counter 86 to change the binary states or counts on conductors 34 to the logic attenuator 26. By so controlling the up/down counter 86, the logic attenuator 26 is allowed to increase or decrease the attenuation of the input signals (a), to thus linearly control the AGC circuit.

The embodiment of FIG. 7 is a dynamic receiver having variable gain. That is, it is the type of receiver which can continuously receive an input signal from the signal source 58 without presetting or preconditioning. This in contrast to the operation of the embodiment described in FIG. 3 where, in that embodiment, the data control and timing 22 always preconditioned the AGC circuitry prior to receipt of a message from one of the transponders. Thus, in the embodiment of FIG. 7, a data control and timing is not needed to precondition the circuitry prior to receipt of data signals from signal source 58. However, a clock source 78 is provided for generating a continuously running clock from a conventional oscillator having a pulse repetition frequency similar to that shown in FIG. 8.

To understand the operation of this latter embodiment, reference is first made to the threshold reference voltages V1 and V2 of FIG. 8, as those voltages are applied to amplifiers 66 and 68 of the threshold detector 60 in FIG. 7. It will be noted that whenever the input signal (b) to either one of the amplifiers 66 or 68 exceeds its threshold voltage level, V1 or V2, the affected amplifier will generate a corresponding binary 1 output signal. For example, if the input signal (b) to amplifier 68 goes below the threshold voltage V2, that amplifier will generate an output pulse (C2). In a similar fashion, if the input signal (b) to amplifier 66 exceeds the threshold voltage V1, that amplifier will generate a binary 1 output pulse (C1). Thus, it can be seen that as the output signal (b) of the detector 62 varies above and below the threshold voltages V1 and V2, amplifiers 66 and 68 will generate respective output signals (C1) and (C2). However, if the amplitude of the input signal (b) to those amplifiers is between the threshold voltage V1 and V2, their outputs will be at a binary 0 or low level. It should also be noted, as shown in the timing diagram of FIG. 8, that the output signal (b) from the detector 62 essentially follows the top portion of the envelope of the signal (a). In the example shown, as the input signal (a) to the logic attenuator 26 goes in a negative direction the output signal (b) of the detector likewise goes negative approaching V2. When signal (b) is equal to or less than V2, amplifier 68 will generate an output pulse (C2). The output (C2) from amplifier 68 will thus apply a pulse on conductor 72 to one input of AND gate 76. As shown in FIG. 8, coincidence of the positive transition of the clock signal on conductor 80 with the trailing edge of (C2), enables gate 76 to generate a count-down pulse (d2) on conductor 84. This pulse will cause the up/down counter 86 to decrement its count by one, thus decreasing the amount of attenuation presented by the logic attenuator 26 to the input signal (a). This decrease in attenuation is reflected in the rapid positive jump of signal (b) from the output of the detector 62 as shown in FIG. 8. So long as the amplitude of the output signal (b) from the detector is within the threshold levels of V1 and V2, no output pulses are generated from either amplifier 66 or 68, thus the up/down counter is not enabled to count. However, as shown in FIG. 8, when the output (b) of the detector equals the amplitude of V1, or exceeds V1, amplifier 66 is enabled to generate a binary 1 (C1) output pulse. The (C1) pulse is applied on conductor 70 to one input of gating element 74. Gating element 74 also receives the clock signal on conductor 80. As shown in FIG. 8, when the clock signal goes positive in coincidence with the positive trailing edge of the (C1) pulse, gate 74 is enabled to generate a count-down output pulse (d2) on conductor 82. This pulse will now cause the up/down counter 86 to increment its count by one, thus increasing the amount of attenuation presented to the input signal by logic attenuator 26. This increase in attenuation causes a decrease in the amplitude of signal (b) from the detector as shown in FIG. 8.

As shown, as the RF envelope (a) begins to increase back in a positive direction, signal (b) will thus ramp in a positive direction. Again, as signal (b) approaches and exceeds the amplitude of the voltage V1, a second narrower pulse (C1) is generated and applied to gate 74. Upon the coincidence of the positive rising clock pulse, in conjunction with (C1), the (d1) signal is again generated to thus count the counter 86 up one more increment to further increase the attenuation presented by logic attenuator 26. This causes a rapid decrease in the amplitude of the signal (b) from the output of the detector as shown in FIG. 8. So long as the amplitude of the input signal is sufficiently low to keep the signal (b) at the input of comparators 66 and 68 between V1 and V2, no further output pulses (C1) or (C2) will be generated to effect the operation of the counter 86. However, as shown, as the envelope begins to again drop below the threshold level of V2, a second (C2) output pulse is generated to effect the generation of the second (d2) count-down pulse. In a manner as previously described, the up/down counter 86 will be decremented by 1 to decrease the attenuation and thus bring the amplitude of the input signal (b) to the comparators 66 and 68 back within the threshold levels of V1 and V2. However, as the amplitude of the input signal (a) continues to go lower, the output of the detector will follow that signal and again go below the amplitude of the V2, thus effecting the generation of a third (C2) pulse and a third (d2) pulse to again count the counter down and to further decrease the amount of attenuation presented by attenuator 26. In response to this last (d2) pulse, it can be seen that the output of the detector now provides a signal (b) which is within the threshold level of V1 and V2.

By controlling the amplitude of the input signal (a) as it passes through the logic attenuator, the output of the attenuator on conductor 30 will provide an RF signal to the input of the mixer IF filter amplifier 20 which is low enough and constant enough in amplitude to prevent the amplifier from going into saturation, thus preventing distortion of the received information. Further, if the input signal (a) is comprised of several multiplexed frequencies the operation of the circuit prevents the output of the logic attenuator on line 30 from generating signals of such high amplitude to introduce the aforementioned intermodulation products. In this manner, the amplitude of the output signal on conductor 30 presented to the amplifier 20 is held within a low enough signal range to prevent the generation of intermodulation products in the mixer IF filter amplifier. Thus, any amplifier connected to the output of the logic attenuator is allowed to easily detect the frequency to which that amplifier is tuned.

The present invention can find use in any type of data communication system where the possibility of generating intermodulation products or causing distortion exists. These types of systems, for example, can be RF communication systems, telephone or teletype communication systems, or power line carrier communication systems.

While the apparatus of this invention has been described in connection with the presently preferred embodiments, it should be obvious that modifications to the particularly disclosed embodiments are possible for one skilled in the art without departing from the true spirit of the invention.

What is claimed is:

1. An automatic gain control system for linearly controlling the gain of a receiver having an amplifier for receiving input signals of large varying magnitude applied to the receiver, comprising:
    (a) a source of clock signals;
    (b) a counter having an input for counting pulses and responsive thereto to provide binary output signals representative of counter output states;
    (c) a logic attenuator having an input for receiving said input signals and an output for coupling output signals therefrom to the amplifier of said receiver, said logic attenuator being coupled to said counter and responsive to the binary output signals therefrom, whereby the amplitude of the output signals coupled to the amplifier are attenuated in accordance with the output states of said counter;
    (d) a threshold detector including a switchable integrator, said switchable integrator receiving said clock signals and the output signals from said logic attenuator and responsive thereto for effecting the generation of an output count control signal from said threshold detector, said output count control signal being generated in synchronization with said clock signals and occurring only when the amplitude of the output signals from said logic attenuator are outside a predetermined reference level as detected by said threshold detector; and
    (e) means responsive to said output count control signal and said clock signals for providing said pulses to said counter to effect a change in the output states thereof to control said logic attenuator to maintain the amplitude of the output signals applied to the amplifier from said logic attenuator substantially constant, to thus linearly control the gain of the receiver.

2. The automatic gain control system in accordance with claim 1, wherein said logic attenuator comprises a voltage divider network including switching means coupled to receive the binary output signals from said counter, whereby the input signals applied to said logic attentuator are attenuated in amplitude at the output thereof by a voltage drop across the voltage divider network according to the output states of said counter.

3. The automatic gain control system in accordance with claim 1, wherein said threshold detector further includes a source of reference potential including means for providing said predetermined reference level and comparator means coupled to said switchable integrator and to said means for providing said predetermined reference level for generating said output count control signal when there is a non-comparison in the amplitudes of the output signals from said logic attentuator and the predetermined reference level.

4. The automatic gain control system in accordance with claim 1, wherein said means responsive to said output count control signal and said clock signals comprises a logic element which is enabled to provide said pulses to said counter upon the coincident occurrence of said output count control signal and said clock signals.

5. An automatic gain control system comprising:
    (a) a transponder for generating output signals in response to an interrogation signal;
    (b) a receiver in communication with said transponder and receiving therefrom said output signals, said receiver comprising,
        (1) control and timing means for providing said interrogation signal to said transponder to effect the generation of the output signals therefrom, while further providing clock signals and first and second control signals for said receiver prior to receipt of the output signals from said transponder by said receiver,
        (2) a counter responsive to said first control signal from said control and timing means for presetting said counter to a prescribed count, said counter further having an input for counting pulses and responsive thereto to provide binary output signals representative of counter output states,
        (3) an amplifier
        (4) a logic attenuator having an input for receiving the output signals from said transponder and an output for coupling the output signals to said amplifier, said logic attenuator being coupled to said counter and responsive to the binary output signals therefrom whereby the amplitude of the output signals coupled to said amplifier are attenuated by said logic attenuator in accordance with the output states of said counter,
        (5) a threshold detector including amplitude detector means coupled to the output of said logic attenuator and having switch means responsive to the clock signals from said control and timing means for periodically coupling the output signals from said logic attenuator to said threshold detector to periodically effect the generation of an output count control signal from said threshold detector when the amplitude of the output signals from said logic attenuator exceed a predetermined reference level as detected by said threshold detector, and
        (6) means responsive to said output count control signal from said threshold detector and to said clock signals and to the second control signal from said control and timing means for providing said pulses to the input of said counter to effect a change in the output states thereof to control said logic attenuator to maintain the amplitude of the signals applied to said amplifier substantially constant to linearly control the gain of said receiver.

6. The automatic gain control system in accordance with claim 5, wherein said logic attenuator comprises a voltage divider network including switching means coupled to receive the binary output signals from said counter, whereby the output signals applied to said logic attenuator from said transponder are attenuated in amplitude at the output of said logic attenuator by a voltage drop across the voltage divider network according to the output states of said counter.

7. The automatic gain control system in accordance with claim 5, wherein said threshold detector further comprises a source of reference potential including means for providing said predetermined reference level, and comparator means coupled to said amplitude detector means and to said means for providing said predetermined reference level, for generating said output count control signal when there is a non-comparison in the amplitudes of the predetermined reference level and the output signals coupled to said comparator means from said logic attenuator by said amplitude detector means.

8. The automatic gain control system in accordance with claim 5, wherein said means responsive to said output count control signal, said clock signals and said second control signal comprises a logic element which is enabled to provide said pulses to said counter upon coincidence of those signals applied to said logic element.

9. An automatic gain control system for substantially eliminating intermodulation frequency products from signals transmitted by the system comprising:
(a) a plurality of transponders, each simultaneously generating, in response to an interrogation signal, an output signal of a different frequency of which the magnitude of at least two of the output signals is greater than the magnitude of the other output signals;
(b) a receiver comprising,
(1) a plurality of amplifiers, each being inherently non-linearly responsive to signals of large varying magnitude, and each tuned to a separate frequency for receiving an output signal at its tuned frequency from a transponder transmitting at the tuned frequency,
(2) control and timing means for providing said interrogation signal to said plurality of transponders to effect the generation of the output signals therefrom, while further providing clock signals and first and second control signals for said receiver prior to receipt of the output signals from said plurality of transponders by said receiver,
(3) a counter responsive to said first control signal from said control and timing means for presetting said counter to a prescribed count, said counter further having an input for counting pulses and responsive thereto to provide binary output signals representative of counter output states,
(4) a logic attenuator having an input for receiving the output signals from said plurality of transponders and an output for coupling the output signals to said plurality of amplifiers, said logic attenuator comprising a voltage divider network, including switching means connected between the input and output of said logic attenuator and coupled to receive the binary output signals from said counter, whereby the output signals from said plurality of transponders applied to said logic attenuator are attenuated in amplitude at the output thereof by a voltage drop across the voltage divider network according to the output states of said counter controlling the switching means of said logic attenuator,
(5) a threshold detector including, a source of reference potential for providing a voltage of a predetermined reference level, a comparator means connected to said reference potential and having an input and an output, an amplitude detector coupled between the output of said logic attenuator and the input of said comparator means, said amplitude detector including signal integrator and switch means responsive to the clock signals from said control and timing means for periodically integrating the output signals from said logic attenuator and providing integrated signals proportional in amplitude to the output signals from said logic attenuator, to the input of said comparator means to periodically effect the generation of an output count control signal from the output of said comparator means when the amplitude of the integrated signals exceed the predetermined reference level, and
(6) means coupled to the output of said comparator means and responsive to the output count control signal therefrom and to the clock signals and to the second control signal from said control.

10. A method of linearly controlling the gain of a receiver in a data communication system comprising the steps of:
(a) applying a data signal of large varying magnitude to a digital logic attenuator in said receiver;
(b) applying the data signal from an output of said digital logic attenuator to a switchable integrator;
(c) switching said switchable integrator, whereby the integrator is charged and discharged to periodically develop a voltage signal proportional in magnitude to the amplitude of the data signal from the output of said digital logic attenuator;
(d) comparing the magnitude of the voltage signal from the integrator with a voltage reference of a predetermined value;
(e) generating a control signal when there is a non-comparison in the magnitudes of the compared voltage signal and the voltage reference;
(f) continuously applying binary state signals to said digital logic attenuator; and
(g) changing the states of said binary state signals, during the presence of said control signal and at a time no later than the discharging of the integrator, to effect a change in the amount of attenuation said digital logic attenuator presents to the data signal applied thereto, to thereby maintain the magnitude of the data signal at the output of the logic attenuator substantially constant, and thus linearly control the gain of said receiver.

* * * * *